(12) United States Patent
Chuang et al.

(10) Patent No.: US 9,660,637 B1
(45) Date of Patent: May 23, 2017

(54) DRIVING CIRCUIT AND DRIVING METHOD

(71) Applicant: DELTA ELECTRONICS, INC., Taoyuan (TW)

(72) Inventors: Po-Chin Chuang, Taoyuan (TW); Sheng-Hsi Hung, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/977,662

(22) Filed: Dec. 22, 2015

(51) Int. Cl.
| | | |
|---|---|---|
| H03K 17/04 | (2006.01) |
| H03K 17/10 | (2006.01) |
| H03K 17/687 | (2006.01) |
| H01L 29/20 | (2006.01) |
| H01L 29/778 | (2006.01) |

(52) U.S. Cl.
CPC ....... *H03K 17/102* (2013.01); *H01L 29/2003* (2013.01); *H01L 29/7787* (2013.01); *H03K 17/6871* (2013.01)

(58) Field of Classification Search
USPC ................................................. 327/374–377
See application file for complete search history.

(56) References Cited

U.S. PATENT DOCUMENTS

| | | | | |
|---|---|---|---|---|
| 6,556,053 B2 * | 4/2003 | Stanley | .................... | H02M 1/08 318/293 |
| 6,911,848 B2 | 6/2005 | Vinciarelli | | |
| 8,310,284 B2 * | 11/2012 | Heck | .................... | H03K 17/063 327/108 |
| 8,698,524 B2 * | 4/2014 | Lee | .................... | G11C 7/12 327/108 |
| 8,928,363 B2 * | 1/2015 | Hatanaka | .................... | H01L 27/0629 327/109 |
| 2009/0052216 A1 * | 2/2009 | Iwabuchi | .................... | H02M 7/538 363/132 |
| 2009/0278513 A1 * | 11/2009 | Bahramian | .................... | H01L 21/8258 323/217 |
| 2011/0019454 A1 | 1/2011 | Fotherby | | |
| 2013/0181748 A1 | 7/2013 | Zajc | | |
| 2014/0328122 A1 * | 11/2014 | Barth, Jr. | .................... | G11C 11/4085 365/182 |

FOREIGN PATENT DOCUMENTS

| | | |
|---|---|---|
| CN | 102611288 A | 7/2012 |
| CN | 103915990 A | 7/2014 |
| TW | M488724 U | 10/2014 |

* cited by examiner

*Primary Examiner* — Adam Houston
(74) *Attorney, Agent, or Firm* — CKC & Partners Co., Ltd.

(57) ABSTRACT

A driving circuit configured to control at least one switch element is disclosed in the present disclosure. The driving circuit includes a first voltage generating circuit, a second voltage generating circuit and a driving voltage generating circuit. The first voltage generating circuit is configured to generate a first voltage signal. The second voltage generating circuit is configured to generate a second voltage signal. The driving voltage generating circuit is electrically coupled with the first voltage generating circuit and the second voltage generating circuit. The driving voltage generating circuit outputs at least one driving voltage signal according to the first voltage signal and the second voltage signal. The at least one driving voltage signal comprises three levels. At least one level of the levels is lower than zero level.

20 Claims, 10 Drawing Sheets

100

DRIVING CIRCUIT AND DRIVING METHOD

BACKGROUND

Technical Field

The present disclosure relates to a driving circuit and a driving method thereof. More particularly, the present disclosure relates to a driving circuit and a driving method, in which the driving circuit and the driving method are configured to generate a driving voltage signal having three levels.

Description of Related Art

FIG. 1A is a block diagram illustrating a conventional converter 100. FIG. 1B is a waveform diagram of driving signals Vg1 and Vg2 of a driving circuit 102 in FIG. 1A. As illustrated in FIG. 1A and FIG. 1B, the driving circuit 102 of the converter 100 is configured to generate the driving signals Vg1 and Vg2, and the driving signals Vg1 and Vg2 are configured to separately control switch elements SW1 and SW2 to be turned on or turned off. In a turn-off duration M1 of the switch element SW2, the driving signal Vg1 provides a high voltage to the switch element SW1 to turn on the switch element SW1. At this time, the driving signal Vg1 changing from a low voltage to a high voltage may generate a ringing noise. The ringing noise may interfere with the driving signal Vg2. As a result, the driving signal Vg2 in the turn-off duration M1 may be at a non-zero level, and such a non-zero level may be even higher than a threshold voltage of the switch element SW2, such that the switch element SW2 is turned on by mistake.

In addition, most of the current technology relates to ways in which to speed up the turn-on speed of switch elements. However, speeding up the turn-off speed of the switch elements is also an important issue in this field.

SUMMARY

One embodiment of the present disclosure is related to a driving circuit configured to control at least one switch element. The driving circuit includes a first voltage generating circuit, a second voltage generating circuit and a driving voltage generating circuit. The first voltage generating circuit is configured to generate a first voltage signal. The second voltage generating circuit is configured to generate a second voltage signal. The driving voltage generating circuit is electrically coupled with the first voltage generating circuit and the second voltage generating circuit. The driving voltage generating circuit outputs at least one driving voltage signal according to the first voltage signal and the second voltage signal. The at least one driving voltage signal comprises three levels. At least one level of the levels is lower than zero level.

One embodiment of the present disclosure is related to a driving method of a driving circuit. The driving circuit is configured to control at least one switch element. The driving method includes: generating a first voltage signal; generating a second voltage signal; outputting at least one driving voltage signal according to the first voltage signal and the second voltage signal. The at least one driving voltage signal comprises three levels. At least one level of the levels is lower than zero level and the at least one level is configured to turn off the switch element.

One embodiment of the present disclosure is related to a method of driving a converter circuit. The converter circuit includes a first switch element and a second switch element. The method includes the steps: providing a first voltage signal and a second voltage signal; generating a first driving voltage signal according to the first voltage signal and the second voltage signal to drive the first switch element in a soft-switching manner or in a hard-switching manner; and generating a second driving voltage signal according to the first voltage signal and the second voltage signal to drive the second switch element in a hard-switching manner.

In view of the above, in one embodiment, one of the levels of the driving voltage signal is lower than a zero level. Compared to a traditional method of utilizing a zero-level signal to turn off the switch element, by utilizing a signal whose level is lower than the zero level to turn off the switch element, inadvertently turning on the switch element may be prevented.

In addition, in one embodiment, the above, lower-than-zero level may speed up the turn-off speed of the switch element.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
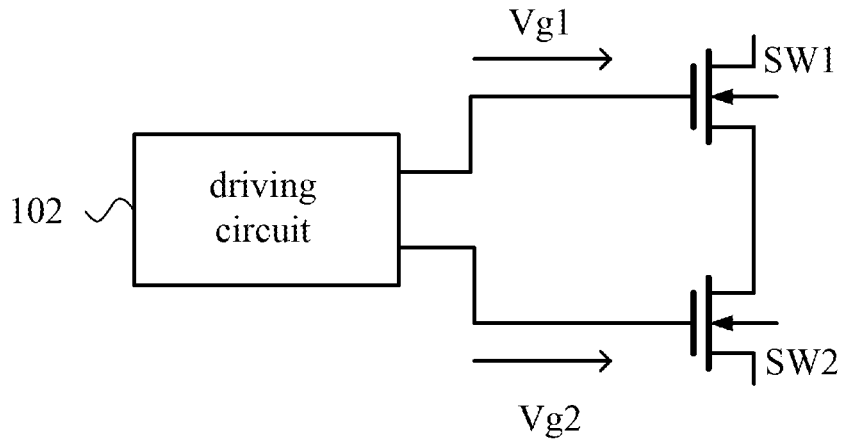
FIG. 1A is a block diagram illustrating a conventional converter.
Figure 1B:
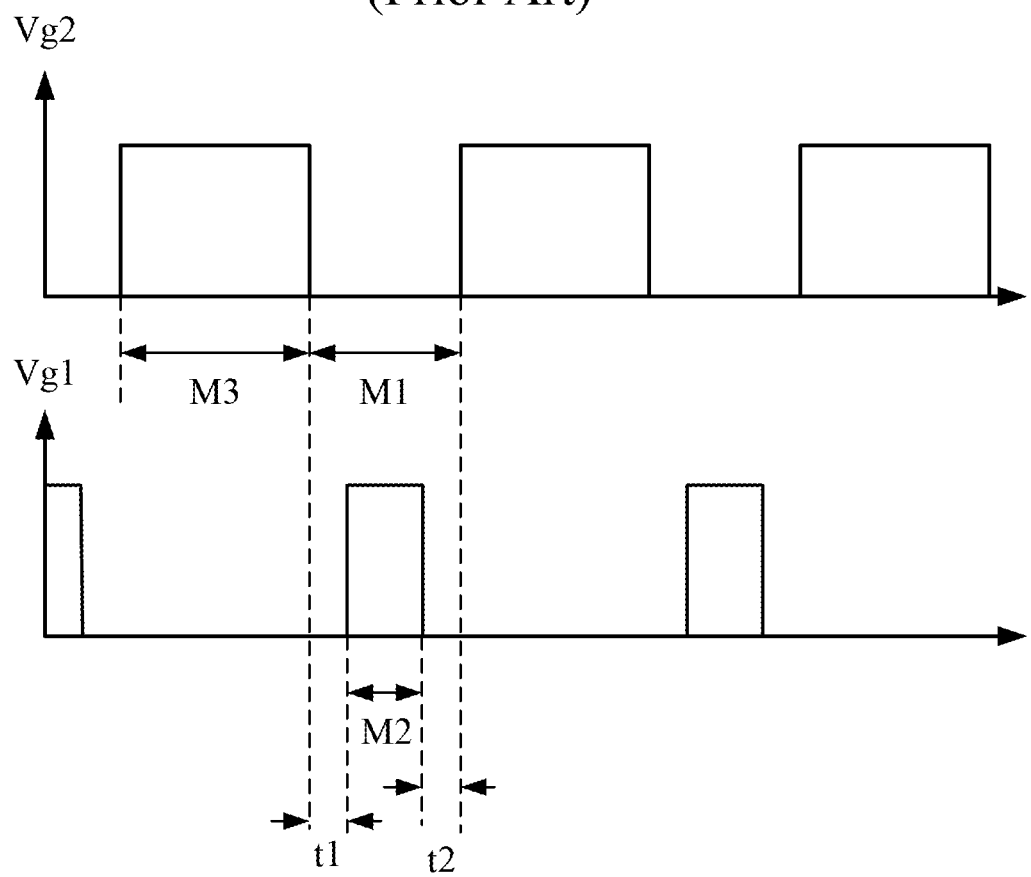
FIG. 1B is a waveform diagram of driving signals of a driving circuit in FIG. 1A.

The present disclosure will now be described more fully hereinafter with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 2:
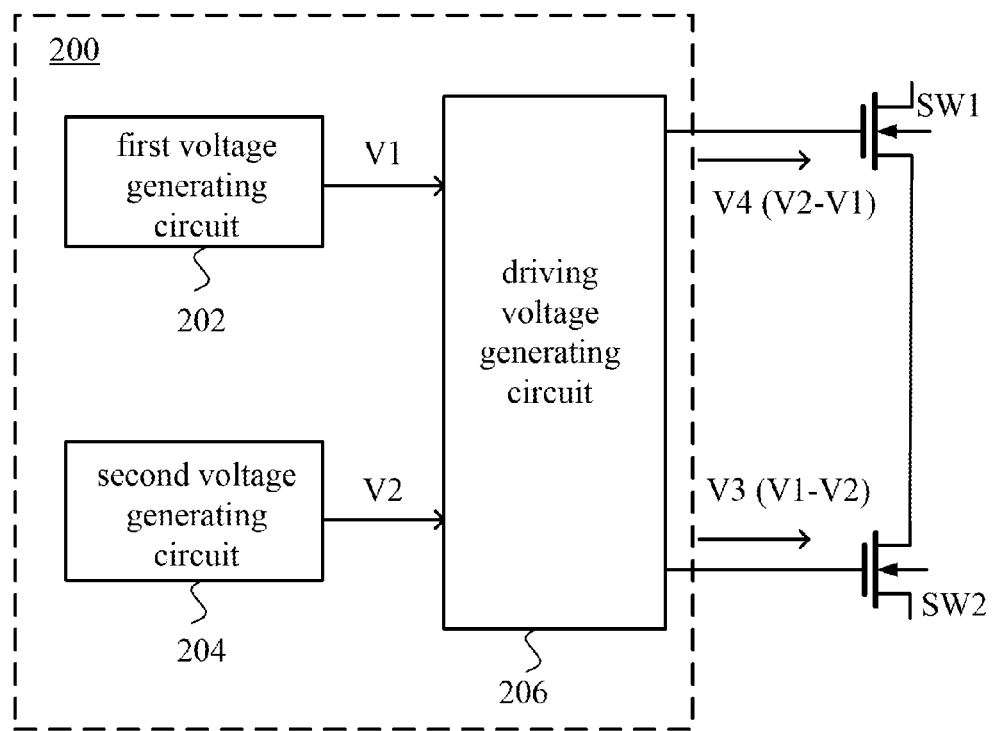
FIG. 2 is a block diagram illustrating a driving circuit and switch elements according to one embodiment of the present disclosure.

FIG. 2 is a block diagram illustrating a driving circuit 200 and switch elements SW1 and SW2 according to one embodiment of the present disclosure. The driving circuit 200 is configured to control the switch elements SW1 and SW2. In some embodiments, the switch elements SW1 and SW2 are enhancement GaN (e-GaN) switches, but are not limited thereto.

As illustrated in FIG. 2, the driving circuit 200 includes a first voltage generating circuit 202, a second voltage generating circuit 204 and a driving voltage generating circuit 206. The first voltage generating circuit 202 and the second voltage generating circuit 204 are electrically coupled with the driving voltage generating circuit 206.

Figure 3:
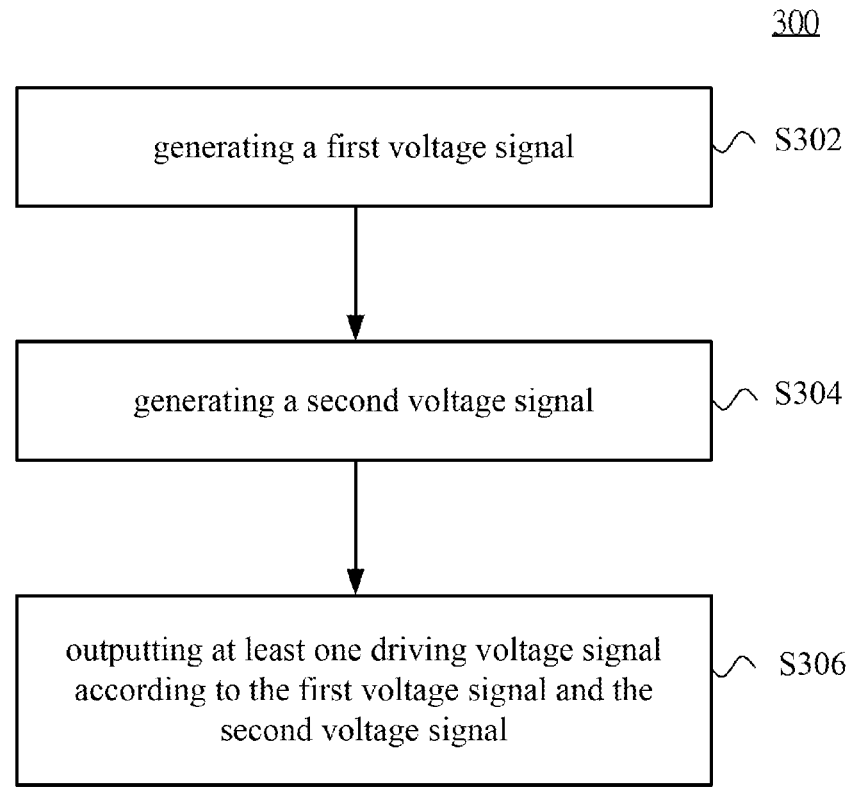
FIG. 3 is a flow diagram illustrating a driving method of a driving circuit according to one embodiment of this disclosure.

FIG. 3 is a flow diagram illustrating a driving method 300 of a driving circuit according to one embodiment of this disclosure. The driving method 300 includes at least steps S302, S304 and S306.

As illustrated in FIG. 2 and FIG. 3, in step S302, the first voltage generating circuit 202 generates a first voltage signal V1. In step S304, the second voltage generating circuit 204 generates a second voltage signal V2. In step S306, the driving voltage generating circuit 206 generates at least one driving voltage signal V3 or V4 according to the first voltage signal V1 and the second voltage signal V2. The first driving voltage signal V3 or the second driving voltage signal V4 has three levels and at least one level is lower than a zero level (i.e., lower than zero volts). The at least one level may be configured to turn off the switch elements SW1 or SW2. Compared to a traditional method utilizing a zero-level signal to turn off the switch elements SW1 or SW2, by utilizing a signal whose level is lower than a zero level to turn off the switch elements SW1 or SW2, the switch elements SW1 or SW2 are prevented from being turned on by mistake. In other embodiments, the level that is lower than a zero level may speed up the turn-off speed of the switch element SW1 or SW2.

In some embodiments, the first driving voltage signal V3 or the second driving voltage signal V4 is associated with the difference between the first voltage signal V1 and the second voltage signal V2. In some embodiments, the first driving voltage signal V3 is equal to V1-V2 and the second driving voltage signal V4 is equal to V2-V1.

Figure 4:
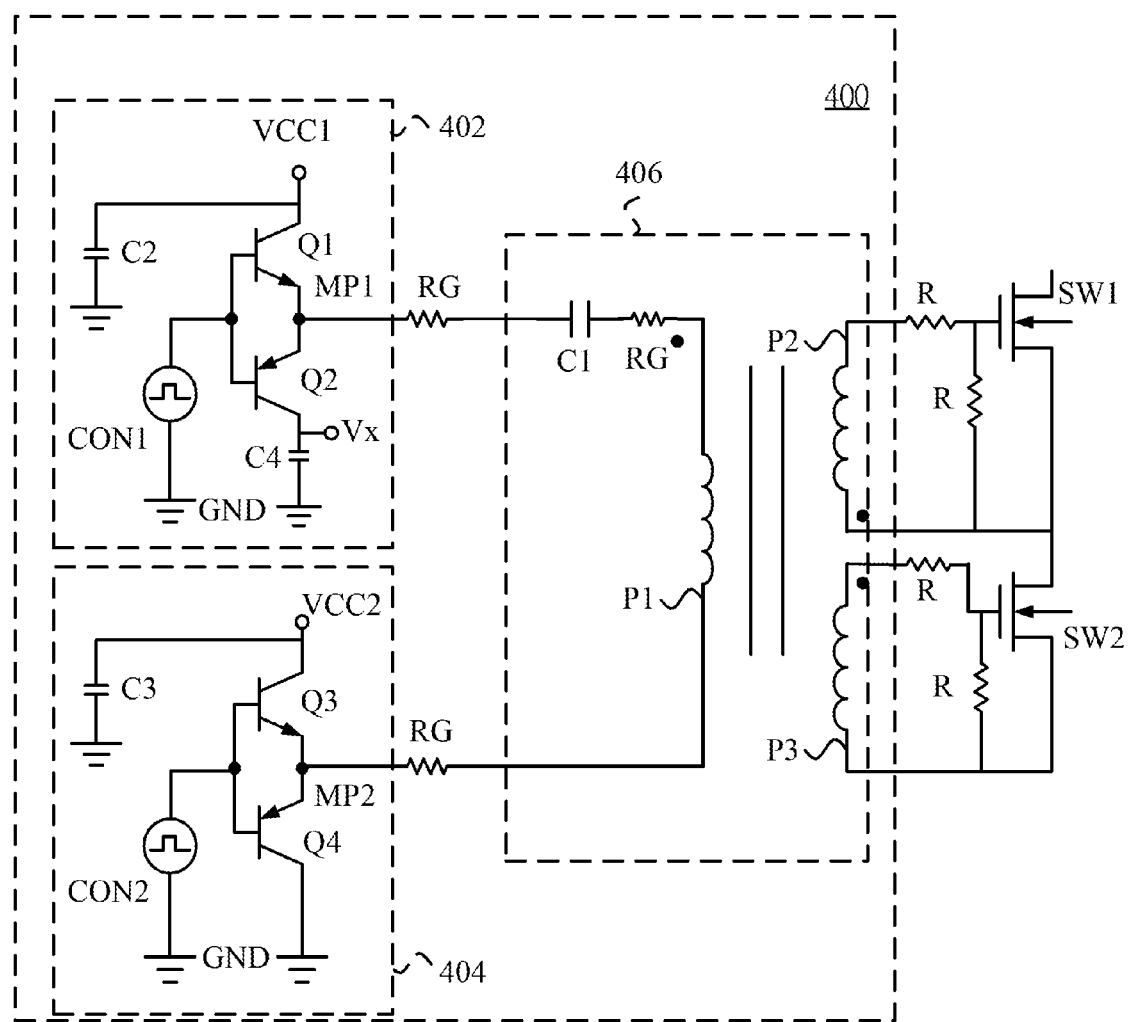
FIG. 4 is a block diagram illustrating a driving circuit and switch elements according to another embodiment of this disclosure.

FIG. 4 is a block diagram illustrating a driving circuit 400 and switch elements SW1 and SW2 according to another embodiment of this disclosure. As illustrated in FIG. 4, the driving circuit 400 includes a first voltage generating circuit 402, a second voltage generating circuit 404 and a driving voltage generating circuit 406.

The first voltage generating circuit 402 includes a first transistor Q1 and a second transistor Q2. Control terminals of the first transistor Q1 and the second transistor Q2 receive a control signal from a control signal source CON1. According to the control signal, the first voltage generating circuit 402 outputs the first voltage signal V1 at a first node MP1. In greater detail, a first terminal of the first transistor Q1 is configured to receive a first input voltage VCC1, and a second terminal of the first transistor Q1 is electrically coupled with the first node MP1. A first terminal of the second transistor Q2 is electrically coupled with the first node MP1, and a second terminal of the second transistor Q2 is configured to receive a first middle voltage Vx. In some embodiments, the first input voltage VCC1 is higher than the first middle voltage Vx.

The second voltage generating circuit 404 includes a third transistor Q3 and a fourth transistor Q4. Control terminals of the third transistor Q3 and the fourth transistor Q4 receive a control signal from a control signal source CON2. According to the control signal, the second voltage generating circuit 404 outputs the second voltage signal V2 at a second node MP2. In greater detail, a first terminal of the third transistor Q3 is configured to receive a second input voltage VCC2, and a second terminal of the third transistor Q3 is electrically coupled with the second node MP2. A first terminal of the fourth transistor Q4 is electrically coupled with the second node MP2, and a second terminal of the fourth transistor Q4 is coupled with ground GND.

Figure 5:
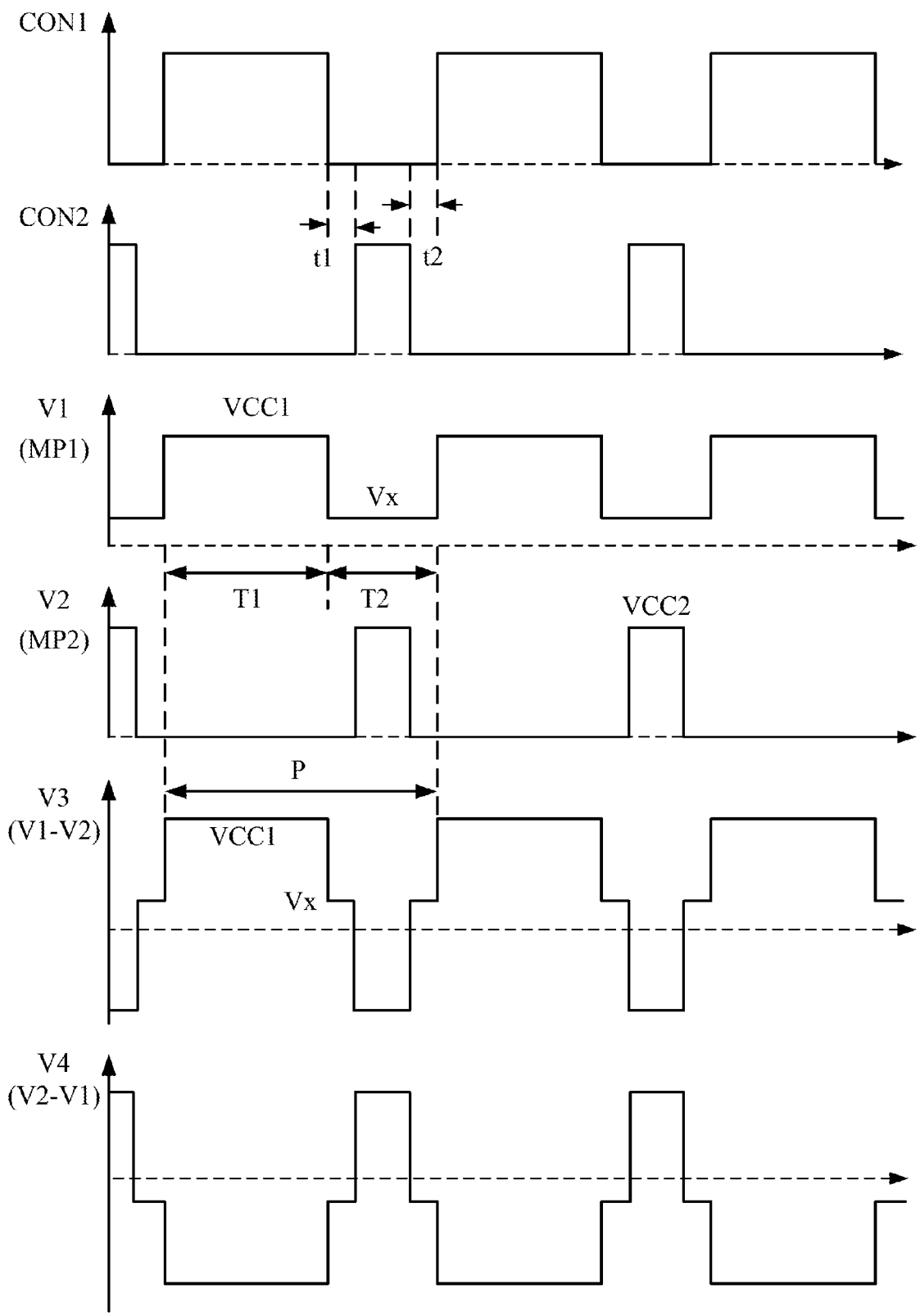
FIG. 5 is a waveform diagram of control signals of control signal sources, a first voltage signal, a second voltage signal, a first driving voltage signal and a second driving voltage signal in FIG. 4.

FIG. 5 is a waveform diagram of control signals of the control signal sources CON1 and CON2, the first voltage signal V1, the second voltage signal V2, the first driving voltage signal V3 and the second driving voltage signal V4 in FIG. 4. As illustrated in FIG. 4 and FIG. 5, the first transistor Q1 is turned on and the second transistor Q2 is turned off when the control signal of the control signal source CON1 has a high level, so that the first input voltage VCC1 is transmitted to the first node MP1. On the other hand, the first transistor Q1 is turned off and the second transistor Q2 is turned on when the control signal of the control signal source CON1 has a low level, so that the first middle voltage Vx is transmitted to the first node MP1. In addition, the third transistor Q3 is turned on and the fourth transistor Q4 is turned off when the control signal of the control signal source CON2 has a high level, so that the second input voltage VCC2 is transmitted to the second node MP2. On the other hand, the third transistor Q3 is turned off and the fourth transistor Q4 is turned on when the control signal of the control signal source CON2 has a low level, so that the ground voltage (0 volts) is transmitted to the second node MP2.

As described above, the control signal of the control signal source CON1 is configured to control the first voltage signal V1 to be the first input voltage VCC1 in a turn-on duration T1 of a switching period P, and control the first voltage signal V1 to be the first middle voltage Vx in a turn-off duration T2 of the switch period P. The control signal of the control signal source CON2 is configured to control the second voltage signal V2 to be the second input voltage VCC2 in part of the turn-off duration T2 of the switching period P, and control the second voltage signal V2 to be a zero voltage in the remaining time, as illustrated in FIG. 5.

As illustrated in FIG. 4, in some embodiments, the driving voltage generating circuit 406 is a transformer, but is not limited thereto. In other embodiments, the driving voltage generating circuit 406 may be a digital subtractor. The driving voltage generating circuit 406 (in the case when it is a transformer) includes a first primary winding P1, two secondary windings P2 and P3 and a first capacitor C1. The two terminals of the primary winding P1 are separately electrically coupled with the first node MP1 and the second node MP2, and configured to receive the first voltage signal V1 and the second voltage signal V2. The secondary windings P2 and P3 may couple a crossed-voltage of the primary winding P1 and transmit the crossed-voltage to the switch elements SW1 and SW2.

As illustrated in FIG. 4, two terminals of the secondary winding P2 are separately coupled to the gate and the source of the switch element SW1, and two terminals of the secondary winding P3 are separately coupled to the gate and the source of the switch element SW2. By designing the winding direction of the primary winding P1 and the secondary windings P2 and P3, the gate-source voltage of the switch element SW1 may be the first driving voltage signal V4 (V2-V1), and the gate-source voltage of the switch element SW2 may be a second driving voltage signal V3 (V1-V2).

As illustrated in FIG. 5, the first driving voltage signal V3 (V1-V2) has three levels. The three levels are the level of the first input voltage VCC1, the level of the first middle voltage Vx and a negative level. The negative level is configured to turn off the switch element SW2. When the first driving voltage signal V3 (V1-V2) has the negative level, the second driving voltage signal V4 (V2-V1) changes from a low level to a high level. At this time, the second driving voltage signal V4 (V2-V1) may generate a ringing noise. The negative level of the first driving voltage signal V3 (V1-V2) may be configured to prevent the switch element SW2 from being turned on by mistake due to the ringing noise.

As illustrated in FIG. 4 and FIG. 5, in some embodiments, the first driving voltage signal V3 of the driving circuit 400 may be configured to drive the switch element SW2 in a soft-switching manner and to reduce noise. Moreover, the second driving voltage signal V4 of the driving circuit 400 may be configured to drive the switch element SW1 in a hard-switching manner and to reduce noise.

In addition, in some embodiments, the first middle voltage Vx is lower than a threshold voltage of the switch element SW2, so that the first middle voltage Vx may be configured to turn off the switch element SW2 during the dead time t1 and t2. The first middle voltage Vx may reduce the voltage drop of the switch element SW2 when the switch element SW2 is reversely conducted. In addition, the control signal source CON2 may be configured to control the dead time t1 and t2 to reduce dead time loss.

In some embodiments, as illustrated in FIG. 4, the first voltage generating circuit 402 further comprises a second capacitor C2, and the second capacitor C2 may provide and maintain the first input voltage VCC1. In some embodiments, the second voltage generating circuit 404 further comprises a third capacitor C3, and the third capacitor C3 may provide and maintain the second input voltage VCC2. In some embodiments, the first voltage generating circuit 402 further comprises a fourth capacitor C4, and the fourth capacitor C4 may provide and maintain the first middle voltage Vx.

The driving circuit 400 illustrated in FIG. 4 may be configured to reduce the dead time loss and reduce the forward voltage and be implemented to soft switch driving circuit. In addition, the driving circuit 400 illustrated in FIG. 4 may be implemented to a low-side driving of a buck converter or a high-side driving of a boost converter.

In some embodiments, as illustrated in FIG. 4, the driving circuit 400 further comprises some resistor elements RG. The resistor elements RG are configured to reduce ringing noise. In addition, in some embodiments, some resistor elements R may be disposed between the driving circuit 400 and the switch elements SW1 and SW2. The resistor elements R are configured to avoid malfunctioning of the switch elements SW1 and SW2.

Figure 6:
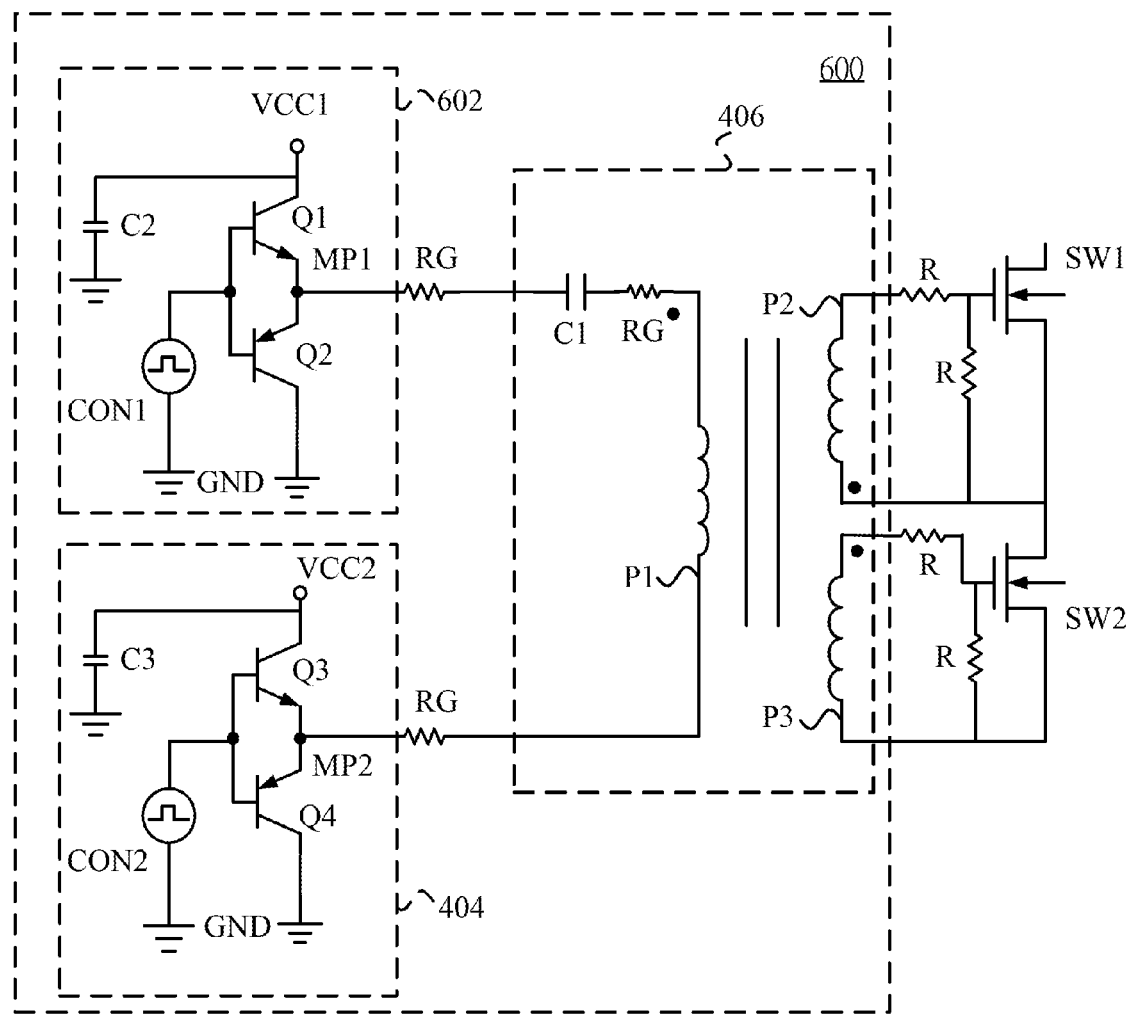
FIG. 6 is a block diagram illustrating a driving circuit and switch elements according to yet another embodiment of this disclosure.

FIG. 6 is a block diagram illustrating a driving circuit 600 and switch elements SW1 and SW2 according to yet another embodiment of this disclosure. The difference between the driving circuit 600 in FIG. 6 and the driving circuit 400 in FIG. 4 is that a second transistor Q2 of the driving circuit 600 is coupled to ground GND, while the second transistor Q2 of the driving circuit 400 is not.

Figure 7:
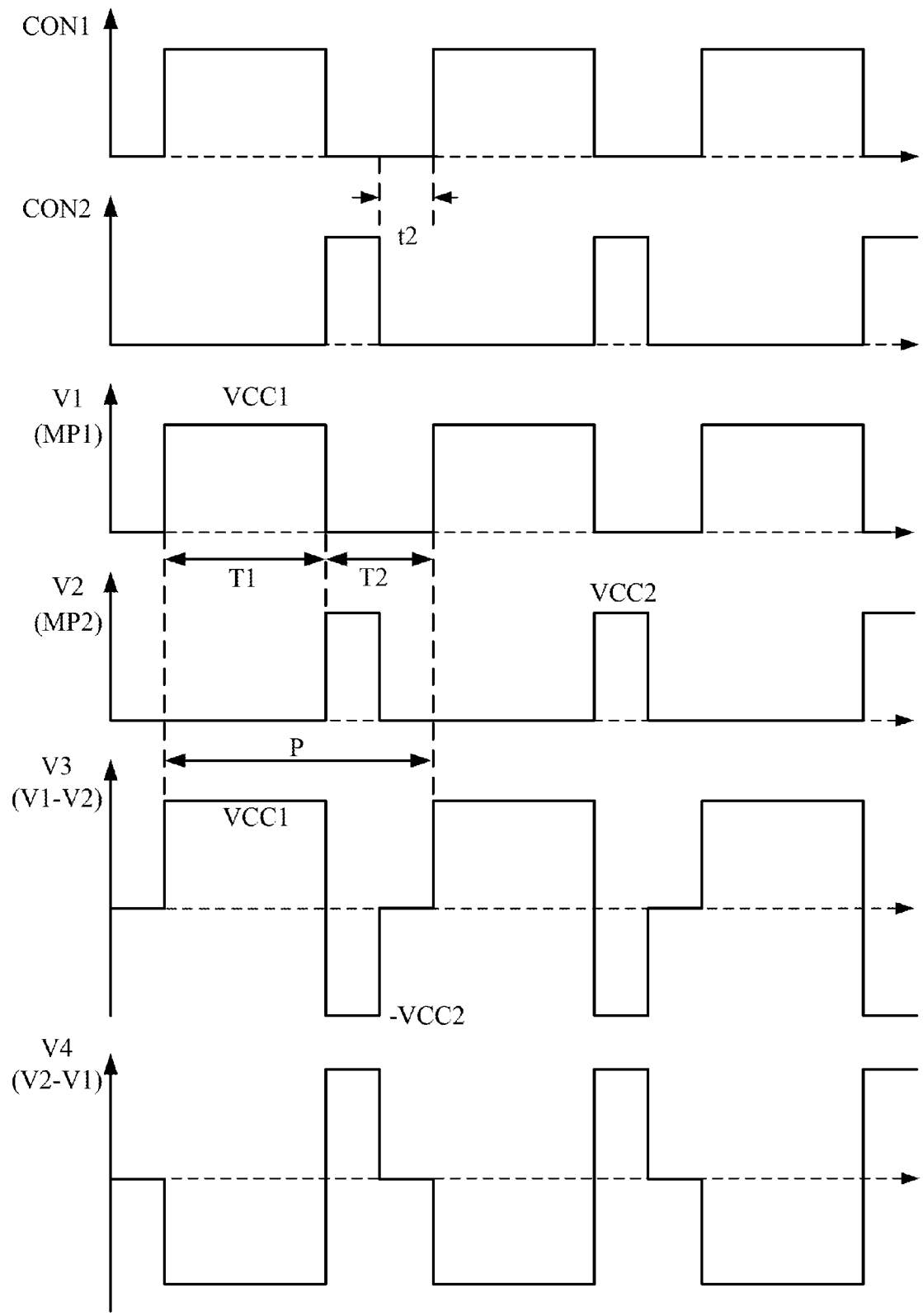
FIG. 7 is a waveform diagram of control signals of control signal sources, a first voltage signal, a second voltage signal, a first driving voltage signal and a second driving voltage signal in FIG. 6.

FIG. 7 is a waveform diagram of control signals of control signal sources CON1 and CON2, a first voltage signal V1, a second voltage signal V2, a first driving voltage signal V3 and a second driving voltage signal V4 in FIG. 6. A second terminal of the second transistor Q2 of the driving circuit 600 is coupled to ground GND, so that the control signal of the control signal source CON2 may control the first voltage signal V1 to be at a zero level (zero volts) during a turn-off duration T2. As an example of the first driving voltage signal V3 (V1-V2), a level (-VCC2) is configured to turn off the switch element SW2. Compared to the traditional method utilizing a zero-level signal to turn off the switch element SW2, utilizing the negative level (-VCC2) may speed up the turn-off speed of the switch element SW2. In addition, in order to get better result, the control signal source CON2 may control the ration of the dead time t2 to the turn-off duration T2 to be larger.

As illustrated in FIG. 6 and FIG. 7, in some embodiments, the first driving voltage signal V3 of the driving circuit 600 may be configured to drive the switch element SW2 in a hard-switching manner and to reduce noise.

Figure 8:
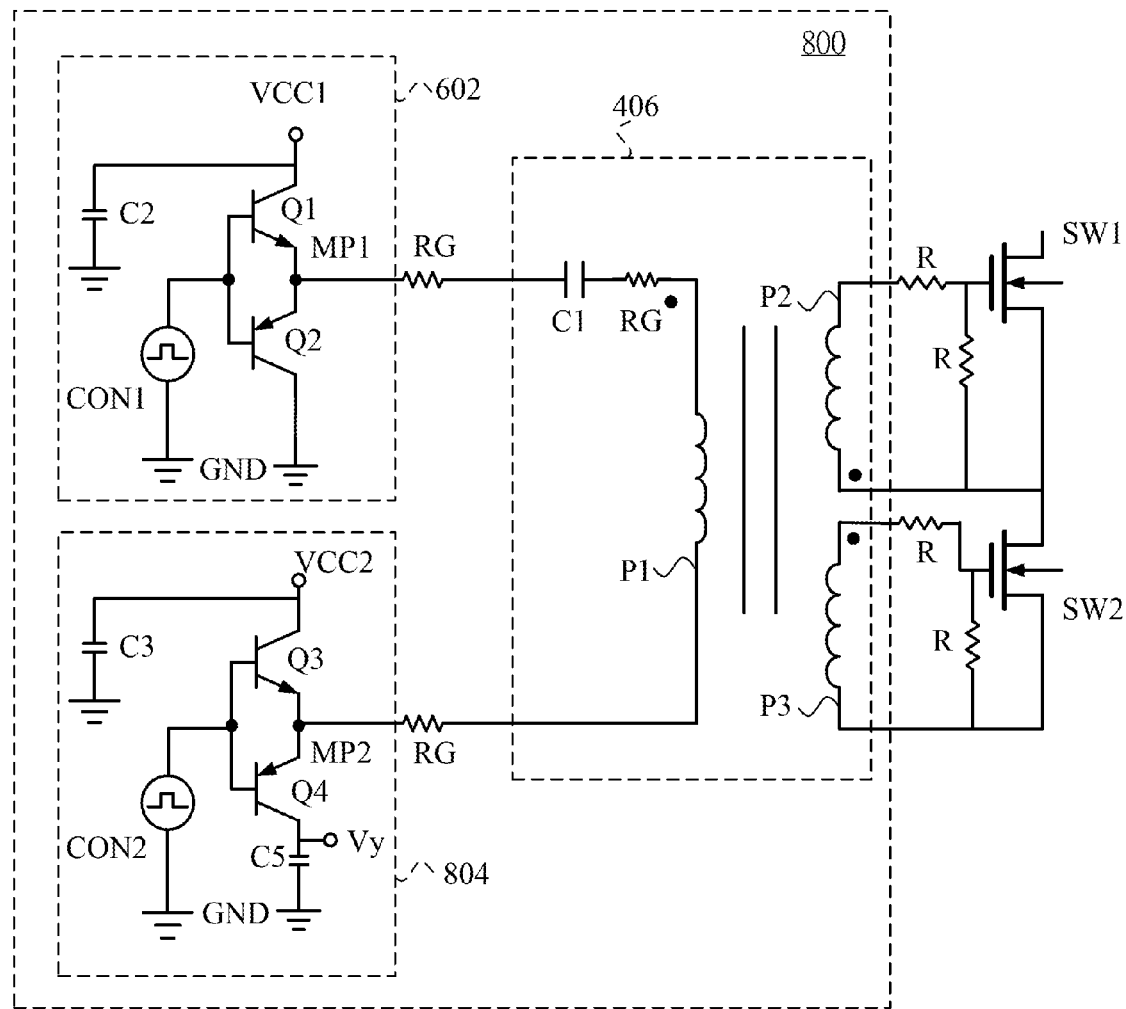
FIG. 8 is a block diagram illustrating a driving circuit and switch elements according to still another embodiment of this disclosure.

FIG. 8 is a block diagram illustrating a driving circuit 800 and switch elements SW1 and SW2 according to still another embodiment of this disclosure. The difference between the driving circuit 800 of FIG. 8 and the driving circuit 600 of FIG. 6 is that a second terminal of a fourth transistor Q4 of the driving circuit 800 is configured to receive a second middle voltage Vy, while the second terminal of the fourth transistor Q4 of the driving circuit 600 is not. In some embodiments, a second voltage generating circuit 804 further comprises a fifth capacitor C5, and the fifth capacitor C5 may provide and maintain the second middle voltage Vy.

Figure 9:
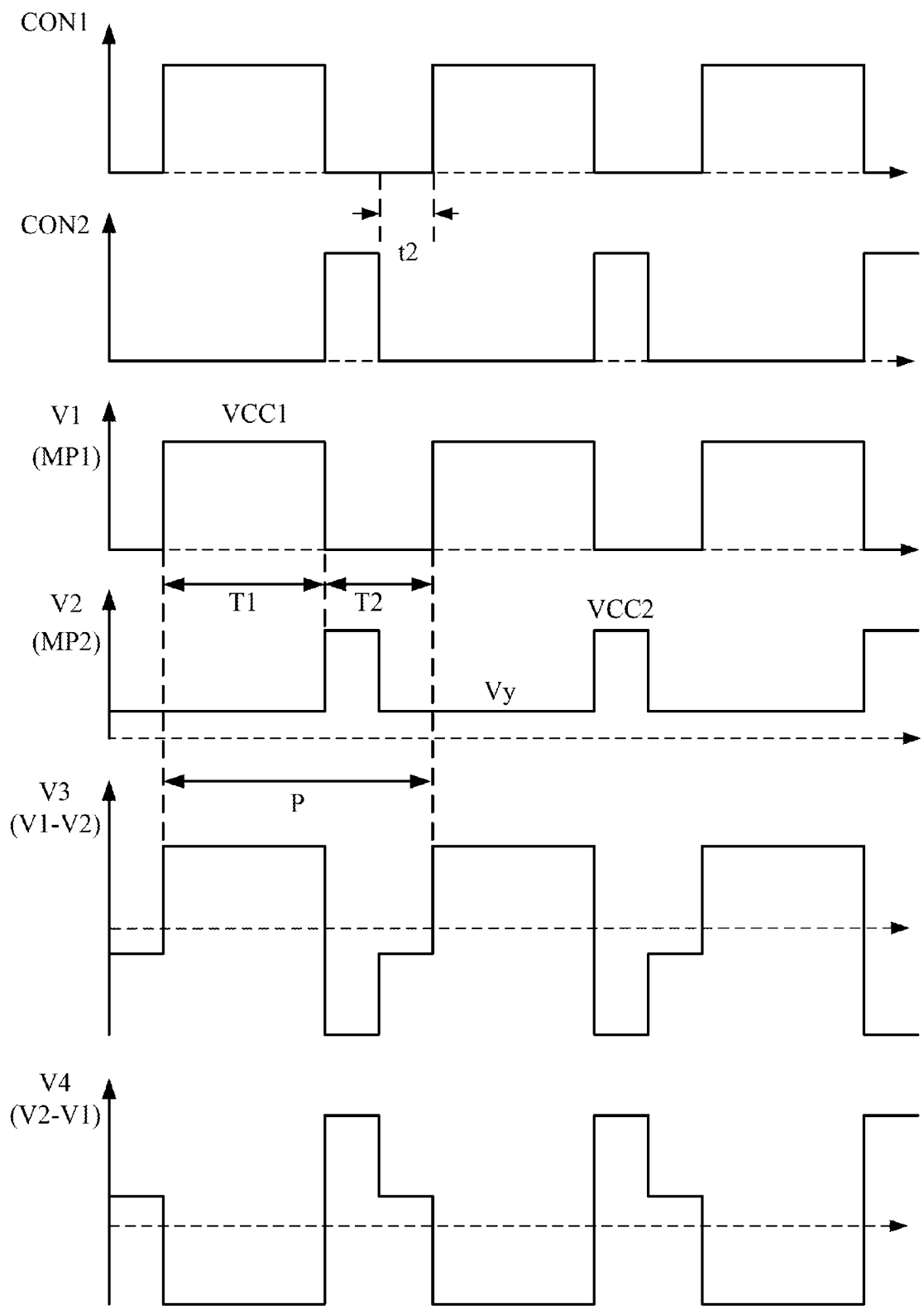
FIG. 9 is a waveform diagram of control signals of control signal sources, a first voltage signal, a second voltage signal, a first driving voltage signal and a second driving voltage signal in FIG. 8.

FIG. 9 is a waveform diagram of control signals of control signal sources CON1 and CON2, a first voltage signal V1, a second voltage signal V2, a first driving voltage signal V3 and a second driving voltage signal V4 in FIG. 8. The second terminal of the fourth transistor Q4 of the driving circuit 800 is configured to receive the second middle voltage Vy, so that the control signal of the control signal source CON2 may control the second voltage signal V2 to be the second middle voltage Vy in a turn-on duration T1 and part of the time of a turn-off duration T2.

Similar to FIG. 7, the first driving voltage signal V3 (V1-V2) in FIG. 9 also has a negative level when entering the turn-off duration T2. This negative level may be configured to speed up the turn-off speed of the switch element SW2.

As illustrated in FIG. 8 and FIG. 9, in some embodiments, the first driving voltage signal V3 of the driving circuit 800 may be configured to drive the switch element SW2 in a hard-switching manner and to reduce noise. The first driving voltage signal V3 of the driving circuit 800 may be configured to speed up the turn-off speed of the switch element SW2.

Moreover, the second driving voltage signal V4 of the driving circuit 800 may be configured to drive the switch element SW1 in a hard-switching manner and to reduce noise. The first driving voltage signal V4 of the driving circuit 800 may be configured to speed up the turn-off speed or the turn-on speed of the switch element SW1.

The driving circuit 600 illustrated in FIG. 6 and the driving circuit 800 illustrated in FIG. 8 may achieve high Dv/dt to reduce the switch turn-on loss and may be implemented to hard switch driving circuit. In addition, the driving circuit 600 illustrated in FIG. 6 and the driving circuit 800 illustrated in FIG. 8 may be implemented to high-side driving of a buck converter or a low-side driving of a boost converter.

Figure 10A:
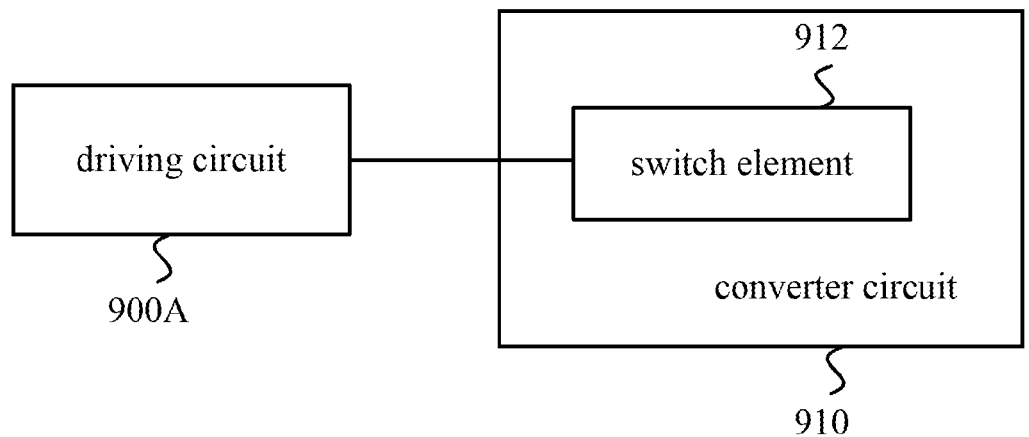
FIG. 10A-10C is a block diagram illustrating a driving circuit and a converter circuit according to yet another embodiment of this disclosure.
Figure 10B:
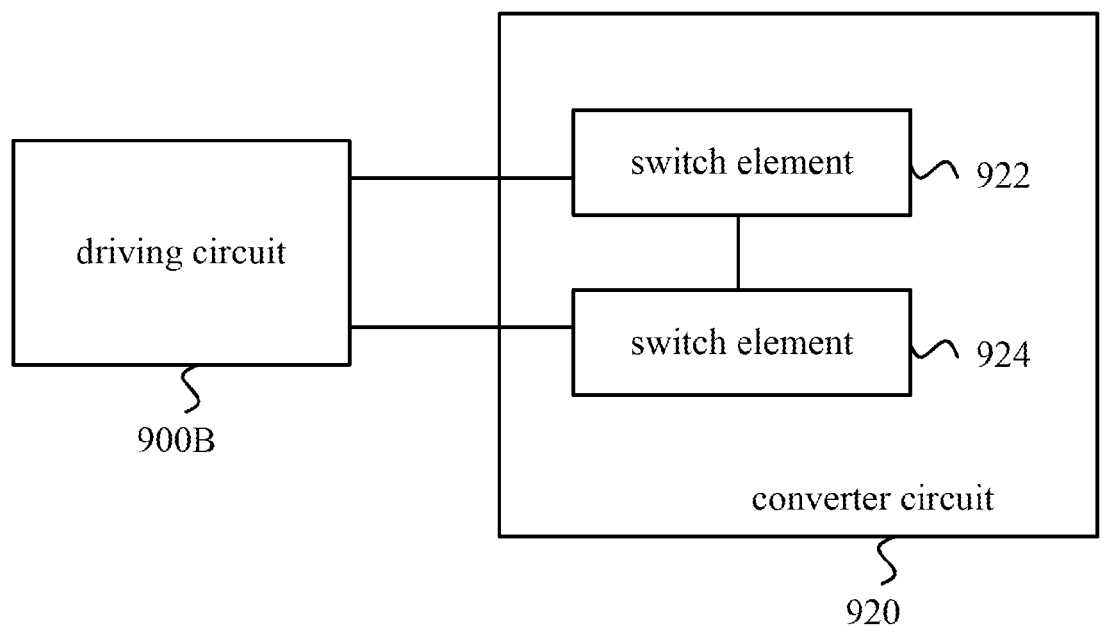
Figure 10C:
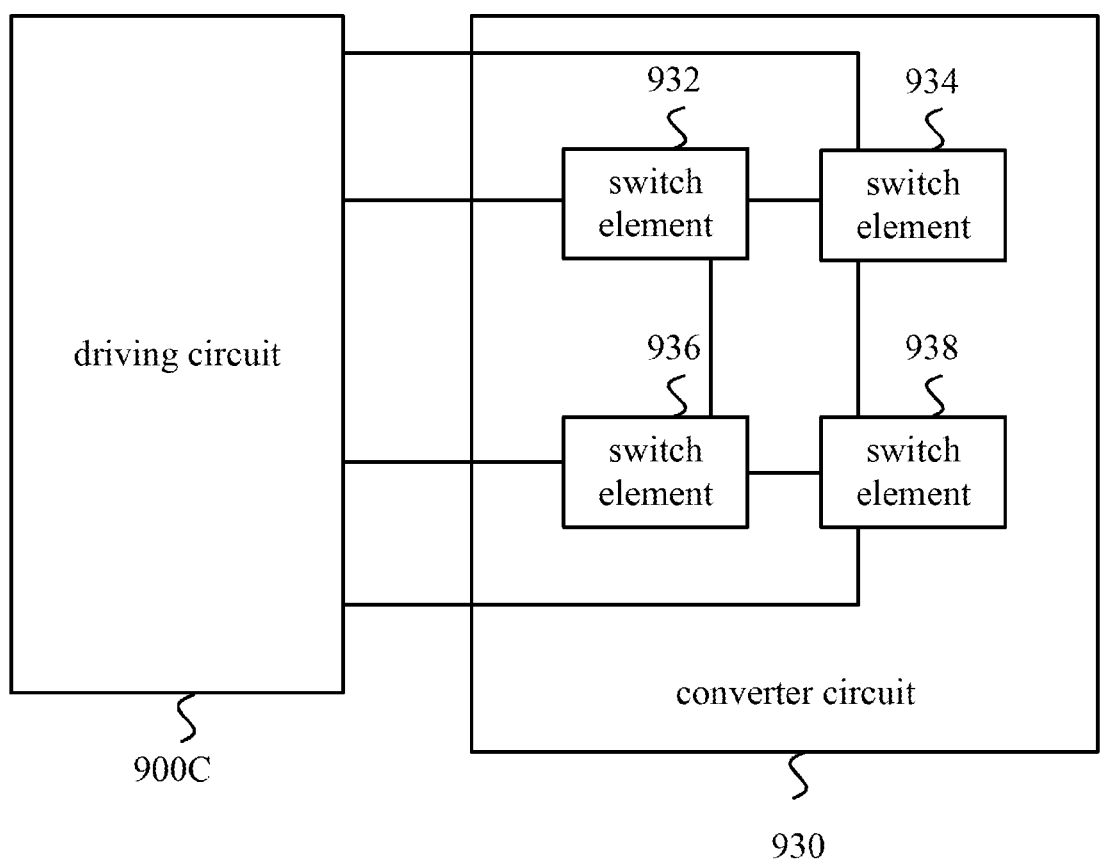

FIG. 10A-10C is a block diagram illustrating a driving circuit and a converter circuit according to yet another embodiment of this disclosure.

As illustrated in FIG. 10A, a converter circuit 910 comprises a switch element 912. The switch element 912 may be a transistor. A driving circuit 900A is configured to drive the switch element 912 of the converter circuit 910. The converter circuit 910 may be a flyback converter circuit, a forward converter circuit or other converter circuit. In some embodiments, the driving circuit 900A may be the driving circuit 400 in FIG. 4, the driving circuit 600 in FIG. 6 or the driving circuit 800 in FIG. 8.

As illustrated in FIG. 10B, a converter circuit 920 comprises two switch elements 922 and 924. The switch element 922 or 924 may be a transistor. A driving circuit 900B is configured to drive the switch elements 922 and 924 of the converter circuit 920. The converter circuit 920 may be a buck converter circuit, a boost converter circuit, a buck-boost converter circuit (set-down and set-up converter) or other converter circuit. In some embodiments, the driving circuit 900B may be the driving circuit 400 in FIG. 4, the driving circuit 600 in FIG. 6 or the driving circuit 800 in FIG. 8.

As illustrated in FIG. 10C, a converter circuit 930 comprises four switch elements 932, 934, 936 and 938. The switch element 932, 934, 936 or 938 may be a transistor. A driving circuit 900C is configured to drive the switch elements 932, 934, 936 and 938 of the converter circuit 930. The converter circuit 930 may be a full-bridge converter circuit or other converter circuit. In some embodiments, the driving circuit 900C may be the driving circuit 400 in FIG. 4, the driving circuit 600 in FIG. 6 or the driving circuit 800 in FIG. 8.

In view of the above, in one embodiment, one of the levels of the each driving voltage signal is lower than a zero level. Compared to a traditional method utilizing a zero-level signal to turn off the switch element, by utilizing a signal having a level that is lower than a zero level to turn off the switch element, the switch element is prevented from being turned on by mistake.

Moreover, the driving circuit may control dead time, such that the output signal of the driving circuit is satisfied to any application in need. In addition, a first middle voltage and a second middle voltage are be implemented in the driving circuit to get a better driving voltage signal.

In addition, in one embodiment, such a lower-than-zero level is also configured to speed up the turn-off speed of the switch element.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A driving circuit configured to control at least one switch element comprising:
  a first voltage generating circuit coupled to a first input voltage and configured to generate a first voltage signal according to a switching period;
  a second voltage generating circuit coupled to a second input voltage and configured to generate a second voltage signal according to the switching period; and
  a driving voltage generating circuit electrically coupled with the first voltage generating circuit and the second generating circuit, wherein the driving voltage generating circuit outputs at least one driving voltage signal according to the first voltage signal and the second voltage signal, the at least one driving voltage signal comprises three levels, and at least one level of the levels is lower than a zero level,
  wherein the switching period is composed of a turn-on duration and a turn-off duration, and the first voltage signal is controlled to be the first input voltage in all the turn-on duration and is controlled to be a first signal in all the turn-off duration, and the second voltage signal is controlled to be the second input voltage in a part of the turn-off duration and is controlled to be a second signal in other time of the switching period.

2. The driving circuit of claim 1, wherein the at least one driving voltage signal is associated with a difference between the first voltage signal and the second voltage signal.

3. The driving circuit of claim 1, wherein the first voltage generating circuit comprises:
  a first transistor, wherein a first terminal of the first transistor is configured to receive the first input voltage, and a second terminal of the first transistor is electrically coupled with a first node; and
  a second transistor, wherein a first terminal of the second transistor is electrically coupled with the first node, and a second terminal of the second transistor is configured to receive the first signal, wherein the first signal is a first middle voltage,
  wherein the first input voltage is higher than the first middle voltage and the first node is configured to output the first voltage signal.

4. The driving circuit of claim 3, wherein the first middle voltage is lower than a threshold voltage of the switch element.

5. The driving circuit of claim 3, wherein the second voltage generating circuit comprises:
  a third transistor, wherein a first terminal of the third transistor is configured to receive the second input voltage, and a second terminal of the third transistor is electrically coupled with a second node; and
  a fourth transistor, wherein a first terminal of the fourth transistor is electrically coupled with the second node, and a second terminal of the fourth transistor is coupled with the second signal, wherein the second signal is a ground,
  wherein the second node is configured to output the second voltage signal.

6. The driving circuit of claim 5, wherein the second input voltage is higher than the first middle voltage.

7. The driving circuit of claim 1, wherein the first voltage generating circuit comprises:
  a first transistor, wherein a first terminal of the first transistor is configured to receive the first input voltage, and a second terminal of the first transistor is electrically coupled with a first node; and
  a second transistor, wherein a first terminal of the second transistor is electrically coupled with the first node, and a second terminal of the second transistor is coupled with the first signal, wherein the first signal is ground,
  wherein the first node is configured to output the first voltage signal.

8. The driving circuit of claim 7, wherein the second voltage generating circuit comprises:
a third transistor, wherein a first terminal of the third transistor is configured to receive the second input voltage, and a second terminal of the third transistor is electrically coupled with a second node; and
a fourth transistor, wherein a first terminal of the fourth transistor is electrically coupled with the second node, and a second terminal of the fourth transistor is coupled with the second signal, wherein the second signal is ground,
wherein the second node is configured to output the second voltage signal.

9. The driving circuit of claim 7, wherein the second voltage generating circuit comprises:
a third transistor, wherein a first terminal of the third transistor is configured to receive the second input voltage, and a second terminal of the third transistor is electrically coupled with a second node; and
a fourth transistor, wherein a first terminal of the fourth transistor is electrically coupled with the second node, and a second terminal of the fourth transistor is configured to receive the second signal, wherein the second signal is a second middle voltage,
wherein the second input voltage is higher than the second middle voltage and the second node is configured to output the second voltage signal.

10. The driving circuit of claim 1, wherein the driving voltage generating circuit is a transformer, the transformer comprises a primary winding and at least one secondary winding, and the primary winding is electrically coupled with the first voltage generating circuit and the second voltage generating circuit.

11. The driving circuit of claim 10, wherein the secondary winding is electrically coupled with a switch element.

12. The driving circuit of claim 11, wherein the switch element is an enhancement GaN switch.

13. A driving method of a driving circuit, wherein the driving circuit is configured to control a switch element, the driving method comprising:
receiving a first input voltage to generate a first voltage signal according to a switching period;
receiving a second input voltage to generate a second voltage signal according to the switching period; and
outputting at least one driving voltage signal according to the first voltage signal and the second voltage signal, wherein the at least one driving voltage signal comprises three levels, at least one level of the levels is lower than a zero level, and the at least one level is configured to turn off the switch element,
wherein the switching period is composed of a turn-on duration and a turn-off duration, and the first voltage signal is controlled to be the first input voltage in all the turn-on duration and is controlled to be a first signal in all the turn-off duration, and the second voltage signal is controlled to be the second input voltage in a part of the turn-off duration and is controlled to be a second signal in other time of the switching period.

14. The driving method of claim 13, wherein the driving voltage signal is associated with a difference between the first voltage signal and the second voltage signal.

15. The driving method of claim 13, further comprising:
wherein the first signal is a first middle voltage or a zero voltage, wherein the first input voltage is higher than the first middle voltage.

16. The driving method of claim 15, further comprising:
wherein the second input voltage is higher than the first middle voltage.

17. The driving method of claim 13, wherein the switch element is an enhancement GaN switch.

18. A method of driving a converter circuit, wherein the converter circuit comprising a first switch element and a second switch element, the method comprising:
receiving a first input voltage and a second input voltage to provide a first voltage signal and a second voltage signal respectively according to a switching period;
generating a first driving voltage signal according to the first voltage signal and the second voltage signal to drive the first switch element in a soft-switching manner or in a hard-switching manner; and
generating a second driving voltage signal according to the first voltage signal and the second voltage signal to drive the second switch element in a hard-switching manner,
wherein the switching period is composed of a turn-on duration and a turn-off duration, and the first voltage signal is controlled to be the first input voltage in all the turn-on duration and is controlled to be a first signal in all the turn-off duration, and the second voltage signal is controlled to be the second input voltage in a part of the turn-off duration and is controlled to be a second signal in other time of the switching period.

19. The method of claim 18, wherein the first driving voltage signal comprises three levels and at least one level of the levels is lower than a zero level.

20. The method of claim 18, wherein the converter circuit comprises a buck converter circuit, a boost converter circuit, or a buck-boost converter circuit.

* * * * *